US012654556B2

(12) United States Patent
Tikhonov

(10) Patent No.: US 12,654,556 B2
(45) Date of Patent: Jun. 16, 2026

(54) INTELLIGENT HIGH VOLTAGE INTERLOCK LOOP WITH INDIVIDUALIZED DETECTION OF CONNECTOR CONNECTIVITY

(71) Applicant: Fisker Inc., Manhattan Beach, CA (US)

(72) Inventor: Victor Tikhonov, Manhattan Beach, CA (US)

(73) Assignee: Fisker IP/Austria Assets Trust, New York, NY (US)

( * ) Notice: Subject to any disclaimer, the term of this patent is extended or adjusted under 35 U.S.C. 154(b) by 178 days.

(21) Appl. No.: 18/521,926

(22) Filed: Nov. 28, 2023

(65) Prior Publication Data

US 2025/0170895 A1     May 29, 2025

(51) Int. Cl.
B60L 3/00      (2019.01)
G01R 31/00     (2006.01)
G01R 31/66     (2020.01)

(52) U.S. Cl.
CPC .......... B60L 3/0023 (2013.01); G01R 31/007 (2013.01); G01R 31/66 (2020.01)

(58) Field of Classification Search
CPC ...... B60L 3/0023; G01R 31/007; G01R 31/66
See application file for complete search history.

(56) References Cited

U.S. PATENT DOCUMENTS

| | | |
|---|---|---|
| 2011/0210746 A1 | 9/2011 | Yugou et al. |
| 2014/0319916 A1 | 10/2014 | Cummings |
| 2016/0261127 A1 | 9/2016 | Worry et al. |
| 2017/0292982 A1* | 10/2017 | Aceña .................... B60L 3/0069 |
| 2020/0274375 A1 | 8/2020 | Griffiths et al. |
| 2022/0018905 A1 | 1/2022 | Li et al. |
| 2022/0089031 A1 | 3/2022 | NystrÖm |
| 2022/0123542 A1* | 4/2022 | Ting ..................... H02H 1/0007 |
| 2023/0251330 A1* | 8/2023 | Choi ...................... G01R 31/54 |
| | | 324/538 |

OTHER PUBLICATIONS

International Search Report and Written Opinion for PCT Application No. PCT/US2024/057455 mailed Jan. 15, 2025, Authorized Officer: Taina Matos, 9 pages.

* cited by examiner

*Primary Examiner* — Akm Zakaria

(57)                ABSTRACT

The technology disclosed herein enables a detector of a high voltage interlock loop to determine connectivity of high voltage connectors on an individual basis. In a particular example, an apparatus includes a loop current source configured to transmit a loop current for the high voltage interlock loop. The apparatus also includes a first-jumper current source connected to the high voltage interlock loop in parallel with a first jumper of a first high voltage connector. The apparatus further includes a second-jumper current source connected to the high voltage interlock loop after the first-jumper current source and in parallel with a second jumper of a second high voltage connector. Also, the apparatus includes a detector configured to determine connectivity of the two high voltage connectors based on whether the loop current, the first jumper current, or the second jumper current is received by the detector.

20 Claims, 9 Drawing Sheets

COMPUTING SYSTEM 900

COMMUNICATION INTERFACE 960

HIGH VOLTAGE INTERLOCK LOOP HANDLER 930

STORAGE SYSTEM 945

PROCESSING SYSTEM 950

INTELLIGENT HIGH VOLTAGE INTERLOCK LOOP WITH INDIVIDUALIZED DETECTION OF CONNECTOR CONNECTIVITY

BACKGROUND

A high voltage interlock loop works in conjunction with high voltage connectors to enhance safety in electrical systems. The high voltage interlock loop ensures safety conditions, such as properly seated high voltage connectors, are met before high voltage equipment is energized. When integrated with high voltage connectors, the high voltage interlock loop typically incorporates low voltage circuit jumper wires and interlocking mechanisms that engage with the connectors, creating a circuit that must be completed for the high voltage system to activate. For example, high voltage connectors may include features such as alignment notches, keying mechanisms, and the jumper wires. The high voltage interlock loop system utilizes these features to verify that the connectors are correctly aligned and securely engaged. If there is a misalignment or if the connectors are not properly engaged, the high voltage interlock loop remains open, preventing the completion of the interlock loop circuit and, consequently, the activation of the high voltage equipment.

This integration ensures that high voltage systems can only be energized when the connectors are correctly aligned and securely connected, minimizing the risk of electrical accidents, equipment damage, or other safety hazards associated with improper connections in high voltage applications. The high voltage interlock loop acts as a fail-safe mechanism to enhance the overall safety and reliability of electrical systems. While previously limited to mostly industrial/commercial applications, the use of high voltage interlock loops is increasing in consumer space as electric vehicles become more popular. The high voltage electrical systems typically used to power electric vehicles will also benefit from the added safety of high voltage interlock loops.

SUMMARY

The technology disclosed herein enables a detector of a high voltage interlock loop to determine connectivity of high voltage connectors on an individual basis. In a particular example, an apparatus includes a loop current source configured to transmit a loop current for the high voltage interlock loop. The apparatus also includes a first-jumper current source connected to the high voltage interlock loop in parallel with a first jumper of a first high voltage connector. The first-jumper current source is configured to transmit a first jumper current lower than the loop current. The apparatus further includes a second-jumper current source connected to the high voltage interlock loop after the first-jumper current source and in parallel with a second jumper of a second high voltage connector. The second-jumper current source is configured to transmit a second jumper current lower than the first jumper current. Also, the apparatus includes a detector connected to the high voltage interlock loop after the second-jumper current source. The detector is configured to determine connectivity of the first high voltage connector and the second high voltage connector based on whether the loop current, the first jumper current, or the second jumper current is received by the detector.

DETAILED DESCRIPTION

The loop of a high voltage interlock loop refers to an electrical circuit completed when all high voltage connectors on the loop are properly connected. The circuit for the high voltage interlock loop runs at lower current and voltage levels than the high voltage circuit to which the connectors are being connected. The lower current and voltage levels are much safer to human users than those of the high voltage circuit, which allows the high voltage interlock loop to be powered even when one or more connectors are not connected. Each high voltage connector includes high voltage contacts for connecting to a high voltage electrical circuit and low voltage contacts for connecting to the high voltage interlock loop. A jumper wire through the connector passes the high voltage interlock loop current through the connector. If a high voltage connector is not properly seated, the contacts for the jumper wire will not allow current to pass through the connector. The circuit for the high voltage interlock loop will not be completed and a detector for the high voltage interlock loop will recognize that a connector is not properly seated based on no current being received.

If multiple connectors are on the same high voltage interlock loop, any one or more of the connectors may not be connected properly when the detector does not detect a current. The circuit of the high voltage interlock loop will be broken when even one of the connectors is absent or not seated properly for the jumper contacts to connect with the high voltage interlock loop. Breaking the circuit enables the high voltage interlock loop to trigger a power cutoff of the high voltage circuit for safety reason but does not enable the high voltage interlock loop to recognize where the broken circuit occurred. The high voltage interlock loops described below use additional current sources to bypass the jumpers when not connected. By detecting the current from those additional current sources, the detector of the high voltage interlock loop is able to identify which specific connector is not connected. In some examples, a user may be notified about the specific connector rather than the user themselves having to inspect each connector individually to find the improperly seated connector.

Figure 1:
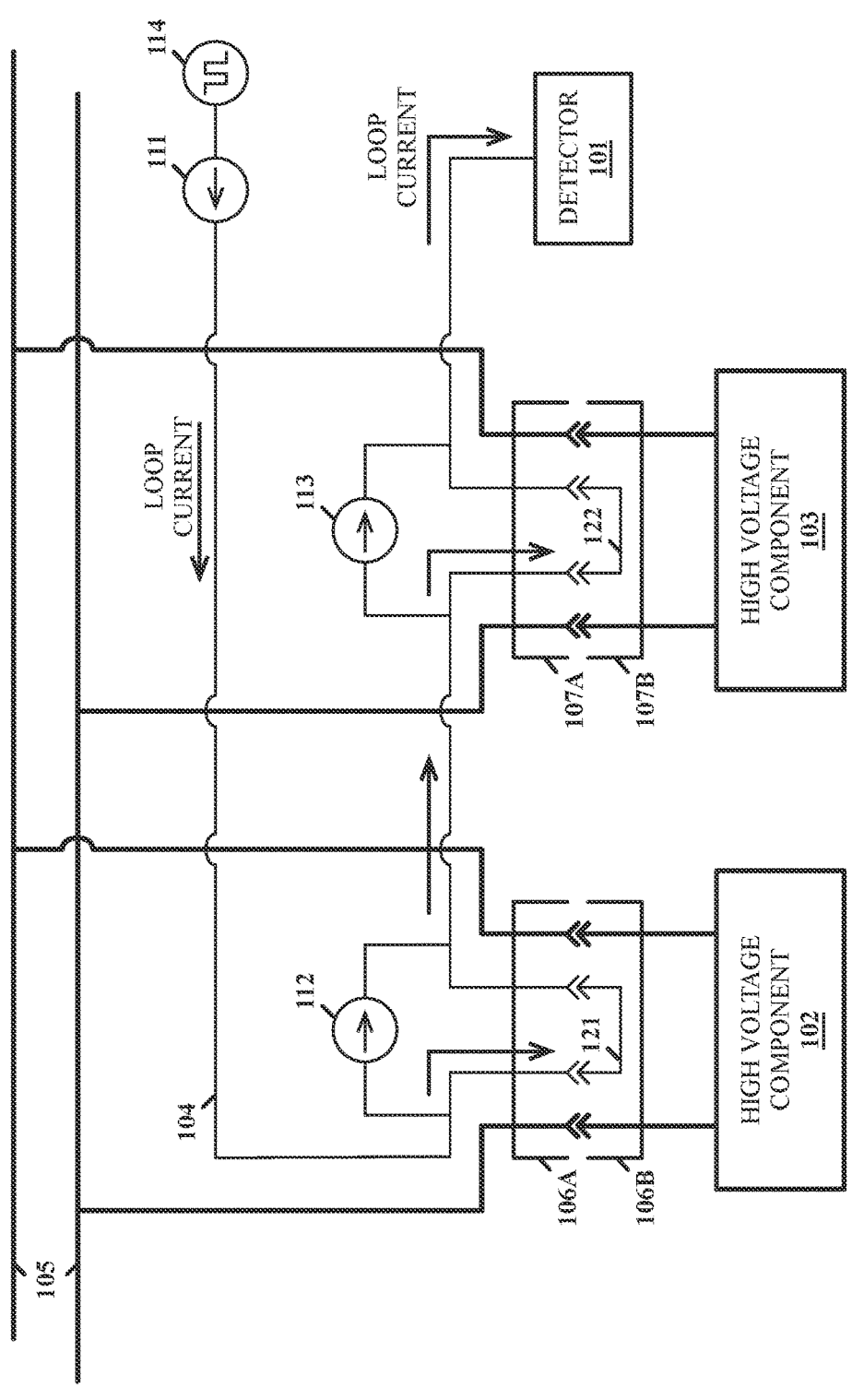
FIG. 1 illustrates an implementation of an intelligent high voltage interlock loop for individualized detection of connector connectivity.

FIG. 1 illustrates implementation 100 of an intelligent high voltage interlock loop for individualized detection of connector connectivity. Implementation 100 includes high voltage interlock loop 104 and high voltage bus 105 to which high voltage component 102 and high voltage component 103 connect. High voltage component 102 connects to high voltage interlock loop 104 and high voltage bus 105 via bus-side connector 106A and component-side connector 106B, collectively referred to as high voltage connector 106, when bus-side connector 106A is properly seated with component-side connector 106B. Similarly, high voltage component 103 connects to high voltage interlock loop 104 and high voltage bus 105 via bus-side connector 107A and component-side connector 107B, collectively referred to as high voltage connector 107, when bus-side connector 107A is properly seated with component-side connector 107B. Each of high voltage connector 106 and high voltage connector 107 includes contacts for connecting to positive and negative buses of high voltage bus 105 as shown. High voltage connector 106 includes contacts for jumper 121, which is a jumper wire within component-side connector 106B, to connect to high voltage interlock loop 104. High voltage connector 107 includes contacts for jumper 122, which is a jumper wire within component-side connector 106B, to connect to high voltage interlock loop 104. High voltage connector 106 and high voltage connector 107 may come in many different shapes and sizes depending on manufacturer, application, or other considerations.

High voltage component 102 and high voltage component 103 are any type of electrical component that either draws power from or provides power to high voltage bus 105. Examples of electrical components that may connect to high voltage bus 105 include inverters, power supplies, batteries, or some other type of high voltage equipment. If either or both of high voltage component 102 and high voltage component 103 are not properly connected to high voltage bus 105, the component may not perform properly and may pose a safety risk if high voltage bus 105 were to be powered. For example, powering high voltage bus 105 with an absent or improperly seated connector may leave users open to dangerous electrical shock or may cause excessive heat buildup at the connection point, which could lead to fires or other damage.

Current source 111 of high voltage interlock loop 104 provides an electrical current for high voltage interlock loop 104. The current from current source 111 is referred to as the loop current in this example because, if all connectors are seated properly, the loop current will reach detector 101 of high voltage interlock loop 104. That is, the loop current will flow from current source 111 through jumper 121 and jumper 122 into detector 101. Detector 101 is connected to high voltage interlock loop 104 such that detector 101 can determine whether the loop current reaches detector 101. If the loop current does not reach detector 101, then one or more of high voltage connector 106 and high voltage connector 107 are disconnected. In this example, rather than the loop current being sent at a constant voltage, waveform generator 114 feeds a voltage waveform into current source 111. If the waveform is not received by detector 101 even though a current is received, then detector 101 may determine that something else is wrong with high voltage interlock loop 104 or a connector connected thereto. Thus, using the waveform provides an additional failsafe to high voltage interlock loop 104.

In a typical high voltage interlock loop configuration, disconnecting one or both of high voltage connector 106 and high voltage connector 107 would break the circuit of high voltage interlock loop 104. Detector 101 would not receive the loop current over that broken circuit. However, in this example, current source 112 is connected high voltage interlock loop 104 in parallel with jumper 121 and current source 113 is connected in parallel with jumper 122. Given that current flows proportional to the resistance on parallel paths, the effect of current source 112 and current source 113 on the current through jumper 121 and jumper 122 will be negligible when high voltage connector 106 and high voltage connector 107 are connected. The resistance through jumper 121 and jumper 122 is extremely low as the inherent resistance of the wire. In contrast, a current source has substantially more resistance (e.g., an infinite resistance may be used for modelling purposes) such that the vast majority of the current will still flow through jumper 121 and jumper 122. Since current source 112 and current source 113 will not receive much if any current, the sources will not be powered enough to produce their own current. If high voltage connector 106 or high voltage connector 107 are disconnected such that the loop current cannot flow through either of jumper 121 and jumper 122, then the loop current will flow through current source 112 or current source 113. Current source 112 or current source 113 would then be powered to generate and transmit the current of current source 112 or current source 113 onto high voltage interlock loop 104. These different currents are detected by detector 101 to determine which of high voltage connector 106 and high voltage connector 107 are disconnected from high voltage interlock loop 104, as detailed below.

Figure 2:
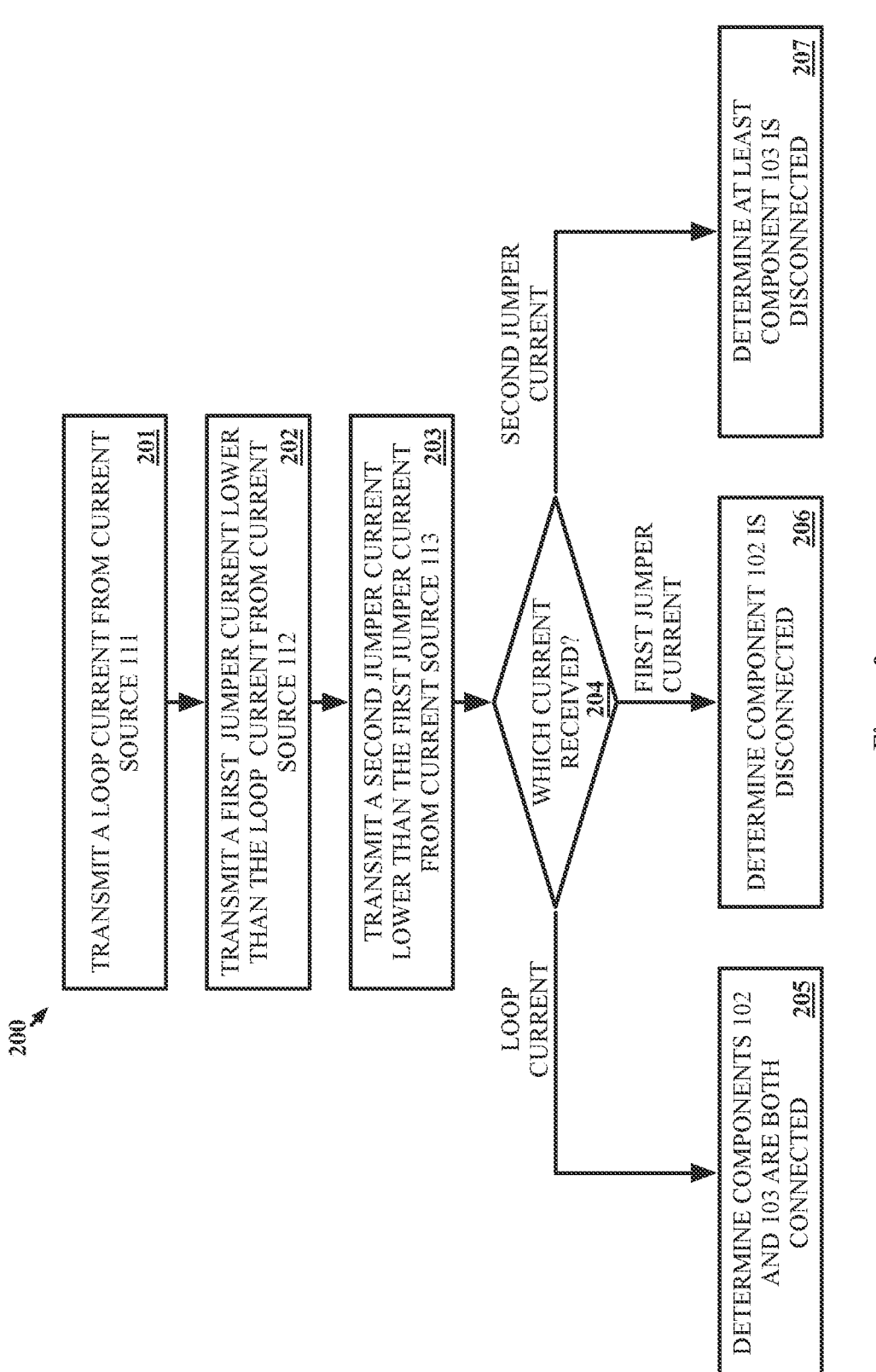
FIG. 2 illustrates an operation to detect connectivity of individual connectors with an intelligent high voltage interlock loop.

FIG. 2 illustrates operation 200 to detect connectivity of individual connectors with an intelligent high voltage interlock loop. In operation 200, current source 111 transmits a loop current onto high voltage interlock loop 104 (Step 201). The loop current may be constant or may be affected by a voltage waveform input into current source 111 from waveform generator 114. The loop current is relatively low (e.g., may be tens of milliamps in magnitude) compared to the currents that high voltage bus 105 is capable of providing. Likewise, the voltage provided by waveform generator 114 may cap out at a relatively low voltage (e.g., 12 volts). Low currents and voltages result in low power transmission over high voltage interlock loop 104, which is safer than the power typically transmitted over high voltage bus 105.

Current source 112 is connected to high voltage interlock loop 104 on the path of the loop current after current source 111. Current source 112 transmits a first jumper current onto high voltage interlock loop 104 (Step 202). As explained above, current source 112 is only powered when continuity exists through jumper 121, which forces the loop current through current source 112. The first jumper current is lower than the loop current to differentiate the first jumper current from the loop current. While a higher current would work as well to differentiate the first jumper current, if the loop current powers current source 112, the current will inherently be less than the loop current.

Similar to current source 112, current source 113 is connected to high voltage interlock loop 104 on the path of the loop current after jumper 121 and current source 112. Current source 113 transmits a second jumper current onto high voltage interlock loop 104 (Step 203). Current source 113 is only powered when continuity exists through jumper 122, which a current through current source 112. Given the position of current source 113 on high voltage interlock loop 104, the current received by current source 113 may be the loop current or the first jumper current from current source 112 depending on whether high voltage connector 106 is connected. The second jumper current is lower than both the loop current and the first jumper current to differentiate the second jumper current from the loop current and first jumper current. The second jumper current will not be higher than the first jumper current because if the first jumper current is powering current source 113, the second jumper current will inherently be less than the first jumper current.

Detector 101 is located at the end of high voltage interlock loop 104 to receive whichever current, if any, reaches detector 101. Detector 101 measures the received current and determines the connectivity of high voltage connector 106 and high voltage connector 107 based on the received current (step 204). If detector 101 receives the loop current, detector 101 determines both high voltage component 102 and high voltage component 103 are connected via their respective high voltage connector 106 and high voltage connector 107 (step 205). The loop current passes to detector 101 via jumper 121 and jumper 122 while current source 112 and current source 113 do not receive enough power to provide their respective jumper currents. The path of the loop current for this scenario is shown in implementation 100.

If detector 101 receives the first jumper current, then detector 101 determines high voltage component 102 is disconnected via high voltage connector 106 (step 206). When high voltage connector 106 is not connected, the loop current cannot pass through jumper 121 and instead powers current source 112. This scenario is described below in operational scenario 300. If detector 101 receives the second jumper current, then detector 101 determines at least high voltage component 103 is disconnected (Step 207). Since either the loop current or the first jumper current can power current source 113, receiving the second jumper current at least indicates high voltage connector 107 lacks connectivity through jumper 122 but could also indicate that high voltage connector 106 lacks connectivity through jumper 121. These scenarios are described below in operational scenarios 400-600.

If detector 101 does not receive any current, then detector 101 may determine that detector 101 is not working properly. For instance, there could be a break in the wire of high voltage interlock loop 104 before, between, or after high voltage connector 106 and high voltage connector 107. It should also be understood that, while operation 200 is described in the context of steps, nothing need occur in any sequence. Current sources 111-113 provide their respective currents when powered and detector 101 detects whichever current reaches detector 101.

Figure 3:
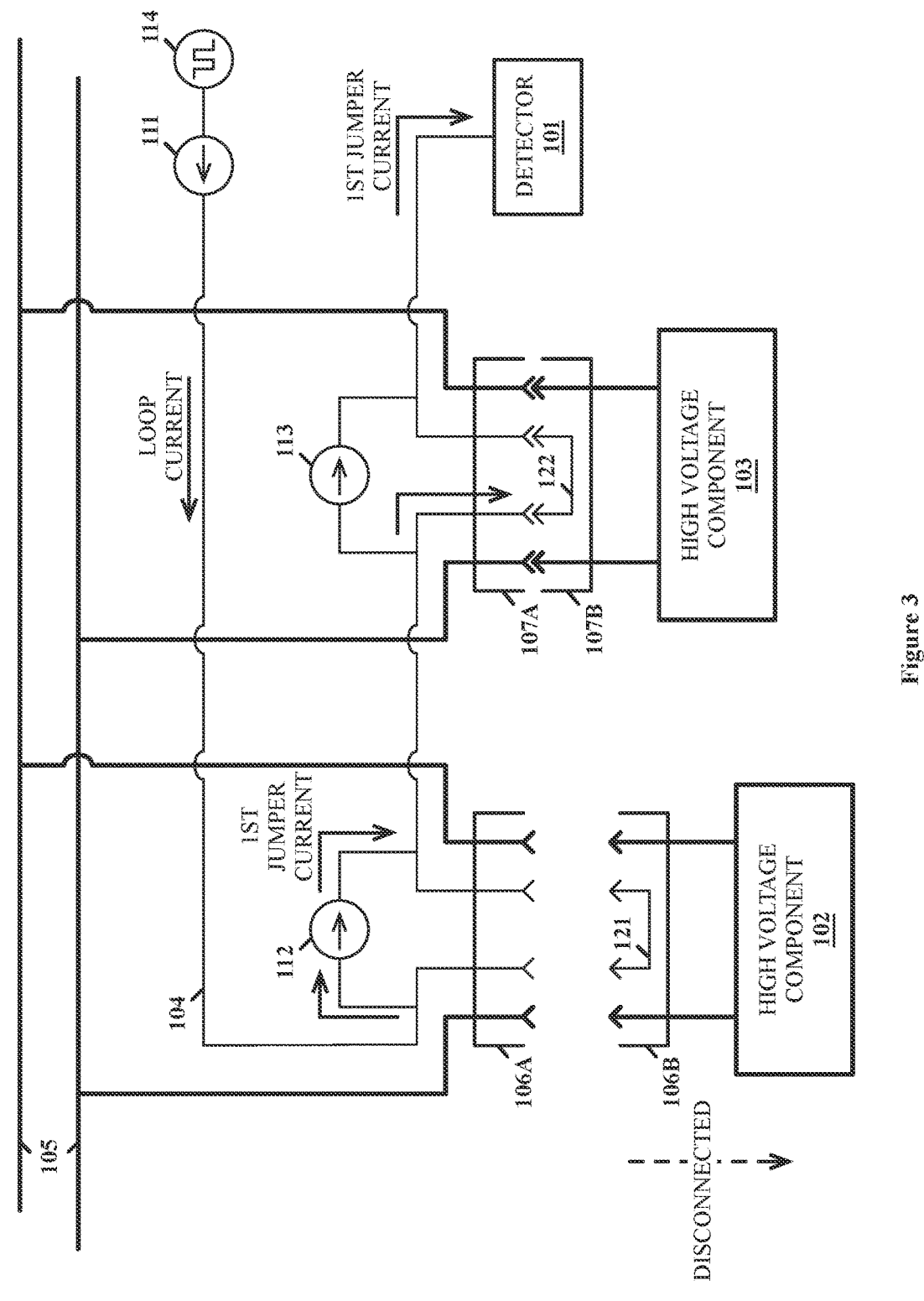
FIG. 3 illustrates an operational scenario to detect connectivity of individual connectors with an intelligent high voltage interlock loop.

FIG. 3 illustrates operational scenario 300 to detect connectivity of individual connectors with an intelligent high voltage interlock loop. In operational scenario 300, high voltage connector 106 is disconnected with contacts of bus-side connector 106A and component-side connector 106B being separated. As such, the loop current cannot travel through jumper 121. Instead, the loop current travels into current source 112, which powers current source 112 to produce the first jumper current. Since high voltage connector 107 is still connected in this example, the first jumper current passes through jumper 122 and does not power current source 113. As such, the first jumper current reaches detector 101. Detector 101 detects the first jumper current and determines high voltage connector 106 lacks connectivity, which indicates high voltage component 102 is disconnected. Since the loop current powering current source 112 includes the voltage waveform from waveform generator 114 in this example, the waveform persists in the first jumper current. In this scenario and the scenarios below, detector 101 also detects the waveform to ensure high voltage interlock loop 104 is working properly.

Figure 4:
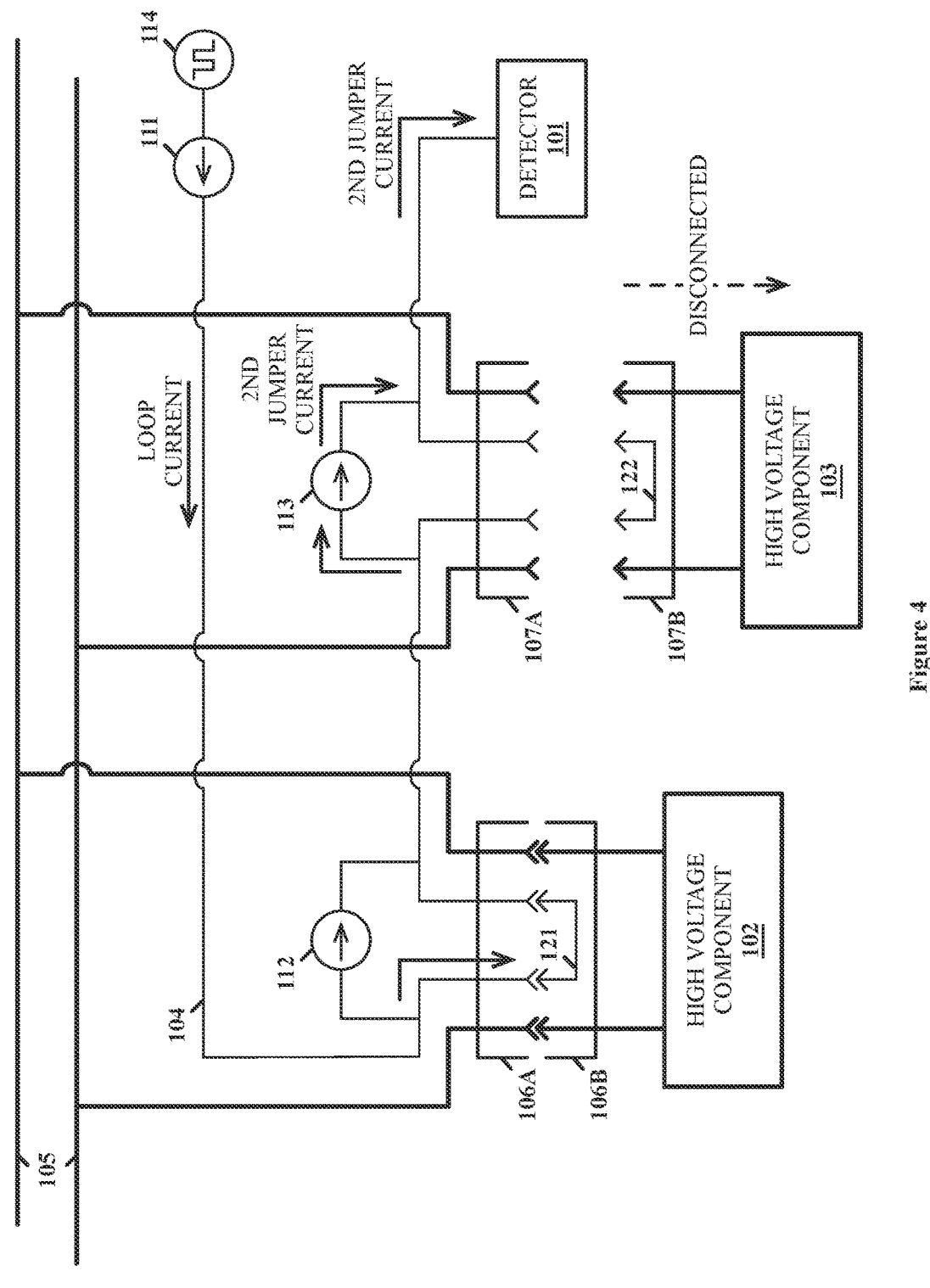
FIG. 4 illustrates an operational scenario to detect connectivity of individual connectors with an intelligent high voltage interlock loop.

FIG. 4 illustrates operational scenario 500 to detect connectivity of individual connectors with an intelligent high voltage interlock loop. In operational scenario 400, high voltage connector 107 is disconnected with contacts of bus-side connector 107A and component-side connector 107B being separated. High voltage connector 106 is connected. As such, the loop current passes through jumper 121, and does not power current source 112, but then cannot pass through jumper 122. Instead, the loop current travels into current source 113, which powers current source 113 to produce the second jumper current. The second jumper current, therefore, is the current that reaches detector 101. Detector 101 detects the second jumper current and determines at least high voltage connector 107 lacks connectivity, which indicates high voltage component 103 is disconnected. However, since current source 113 is the last current source before reaching detector 101, the current powering current source 113 could be either the loop current, as shown in this example, or the first jumper current, as shown in operational scenario 500. Thus, at this point, detector 101 only knows high voltage connector 107 is disconnected.

Figure 5:
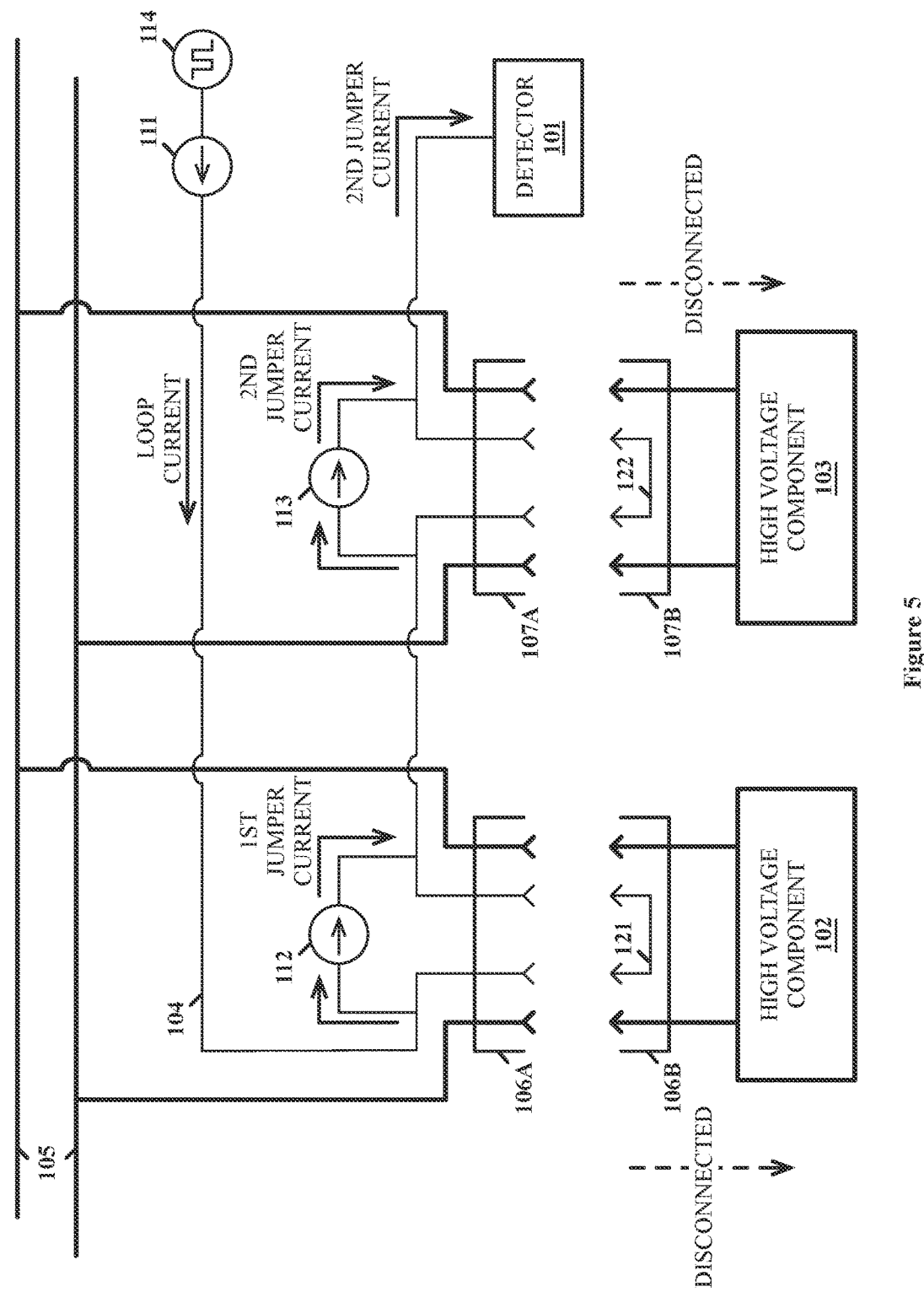
FIG. 5 illustrates an operational scenario to detect connectivity of individual connectors with an intelligent high voltage interlock loop.

FIG. 5 illustrates operational scenario 500 to detect connectivity of individual connectors with an intelligent high voltage interlock loop. In operational scenario 500, high voltage connector 106 is disconnected, like in operational scenario 300, and high voltage connector 107 is disconnected, like in operational scenario 400. As such, current will not be able to flow through either of jumper 121 and jumper 122. First the loop current travels to current source 112 to power current source 112 to produce the first jumper current. The first jumper current then travels to power current source 113 to produce the second jumper current. The second jumper current is received by detector 101 just like in operational scenario 400. Detector 101 is unable to tell the difference between the second jumper current received in operational scenario 400 versus the second jumper current received in operational scenario 500. Thus, detector 101 at this point cannot determine whether high voltage connector 106 is disconnected in addition to high voltage connector 107.

Figure 6:
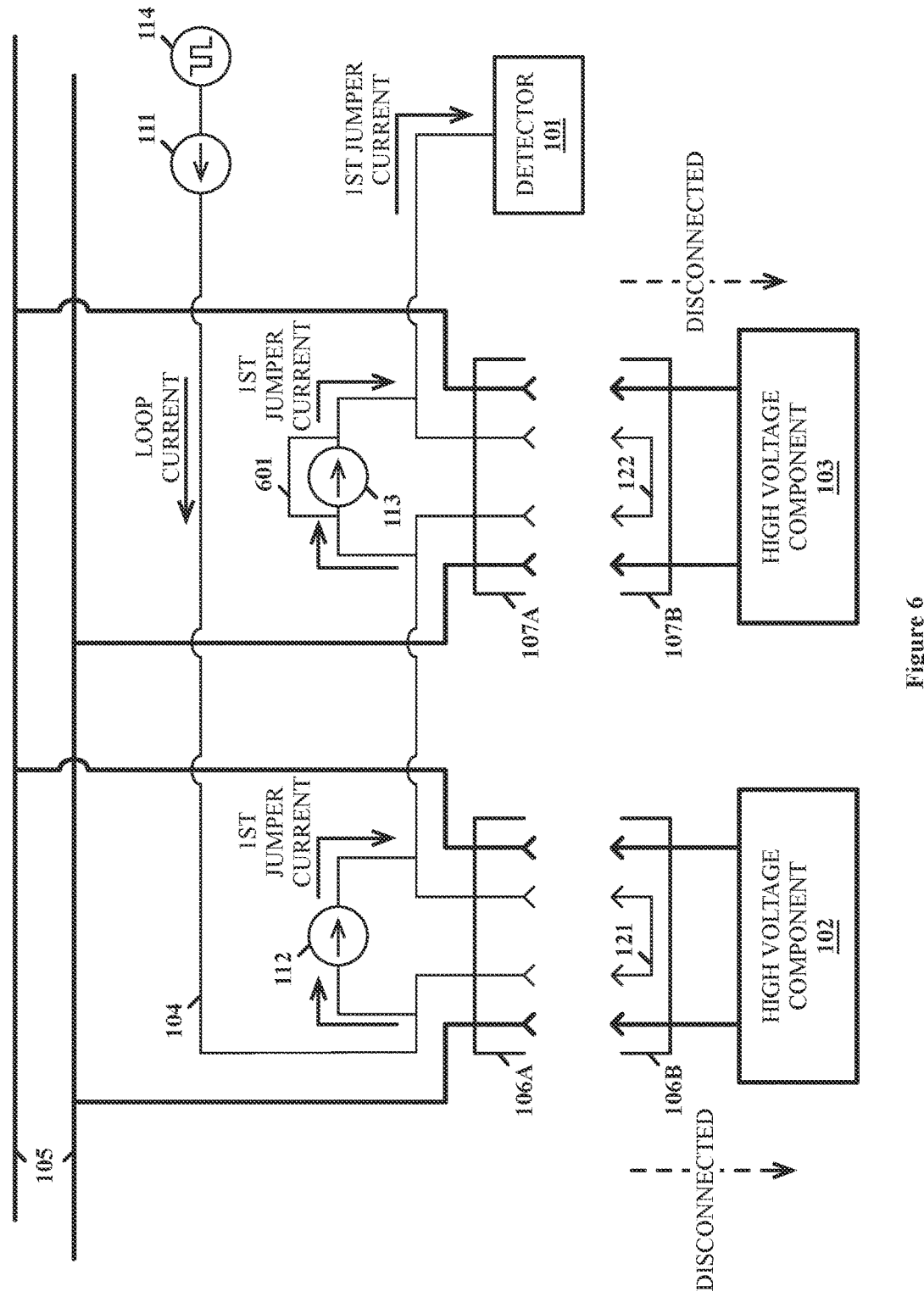
FIG. 6 illustrates an operational scenario to detect connectivity of individual connectors with an intelligent high voltage interlock loop.

FIG. 6 illustrates operational scenario 600 to detect connectivity of individual connectors with an intelligent high voltage interlock loop. In operational scenario 600, temporary jumper 601 is placed in parallel with current source 113 after detector 101 detects the second jumper current. Temporary jumper 601 may be a switch (e.g., relay) that closes when receiving a signal from detector 101 or detector 101 may trigger the placement of temporary jumper 601 in some other manner. Temporary jumper 601 has negligible resistance like jumper 122 had when high voltage connector 107 was connected. Thus, any current previously received by current source 113 now flows through temporary jumper 601 and does not power current source 113 to produce the first jumper current. In this example, since the loop current is powering current source 112, the first jumper current generated by current source 112 passes through temporary jumper 601 and into detector 101. Detector 101 detects the first jumper current and determines that high voltage connector 106 is disconnected along with high voltage connector 107 as previously determined.

Alternatively, if high voltage connector 106 was connected, the loop current would pass through jumper 121 and would not power current source 112. The loop current would, therefore, be the current that passes through temporary jumper 601 and into detector 101. Upon detector 101 detecting the loop current, detector 101 determines that high voltage connector 106 is connected unlike high voltage connector 107, as previously determined.

While the above examples have only two high voltage components connected to high voltage bus 105, additional components may connect to the high voltage bus and be included in high voltage interlock loop 104 in other examples. One such example is described below with respect to implementation 800.

Figure 7:
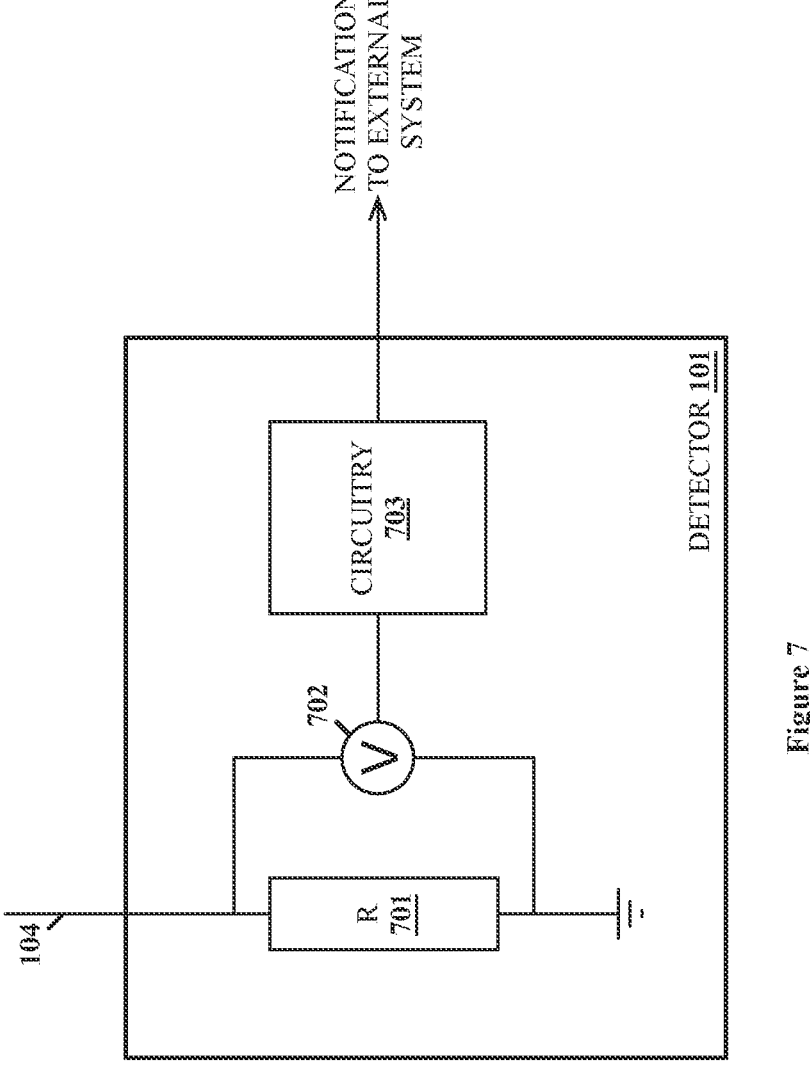
FIG. 7 illustrates an implementation of a detector in an intelligent high voltage interlock loop for individualized detection of connector connectivity.

FIG. 7 illustrates an implementation 700 of a detector in an intelligent high voltage interlock loop for individualized detection of connector connectivity. Implementation 700 includes an example of detector 101. Detector 101 includes components that act as a current-to-voltage converter to convert the current received over high voltage interlock loop 104 to a voltage. The voltage is measured and then the received current is calculated therefrom by circuitry 703. Specifically, detector 101 includes resistor 701 having a resistance known to circuitry 703 and voltmeter 702 connected to circuitry 703. Circuitry 703 includes processing circuitry. The processing circuitry may be hardcoded to perform as described herein or circuitry 703 may include memory circuitry with instructions stored thereon that direct the processing circuitry to perform as described herein. Voltmeter 702 measures the voltage across resistor 701 and provides the measured voltage to circuitry 703. Circuitry 703 divides the voltage measurement by the resistance of resistor 701 to determine the current. The output currents of current sources 111-113 are also known to circuitry 703 such that circuitry 703 compares the current to the output currents to determine which current was received. The waveform being provided by waveform generator 114 will also be present in the voltage in examples where waveform generator 114 is present. While detector 101 includes a basic current-to-voltage converter using resistor 701, other mechanisms may be used by detector 101 to determine the current received at detector 101. Most of those mechanisms will create a voltage that can be measured like the voltage across resistor 701 described above and from which the current is calculated. However, the current may be measured directly or calculated from some other measurement. Also, voltmeter 702 is shown separately from circuitry 703 but circuitry for measuring the voltage across resistor 701 (and possibly resistor 701 as well) may be included in circuitry 703.

In implementation 700, circuitry 703 notifies an external system about the determinations made with respect to the received current. Specifically, circuitry 703 may notify the external system about the connectivity high voltage connector 106 and high voltage connector 107 (or the corresponding high voltage component 102 and high voltage component 103). If no current is received or the waveform is not received by detector 101, circuitry 703 may default to indicating that connections are not present for safety reasons (i.e., high voltage interlock loop 104 is faulty and circuitry 703 may be configured not to risk safety). The external system may notify a user about the connectivity so that the user can take action to fix the issue (e.g., connect the connector or find/install a missing high voltage component). The external system may also be capable of performing actions on its own. For instance, the external system may operate a system in which high voltage component 102 and high voltage component 103 are installed in a different manner based on whether one or more of the components are not connected. In some examples, the external system may be part of an automated manufacturing system. The information from circuitry 703 may be used to determine which high voltage components have been installed in the item (e.g., vehicle) being manufactured and whether the components have been installed properly. For example, the manufacturing system may think high voltage component 102 is installed but detector 101 may still detect the first jumper current indicating that component-side connector 106B may not be seated properly into bus-side connector 106A. In some examples, circuitry 703 may directly control whether high voltage bus 105 is powered or the external system may control power to high voltage bus 105 based on the connectivity information received from circuitry 703.

Figure 8:
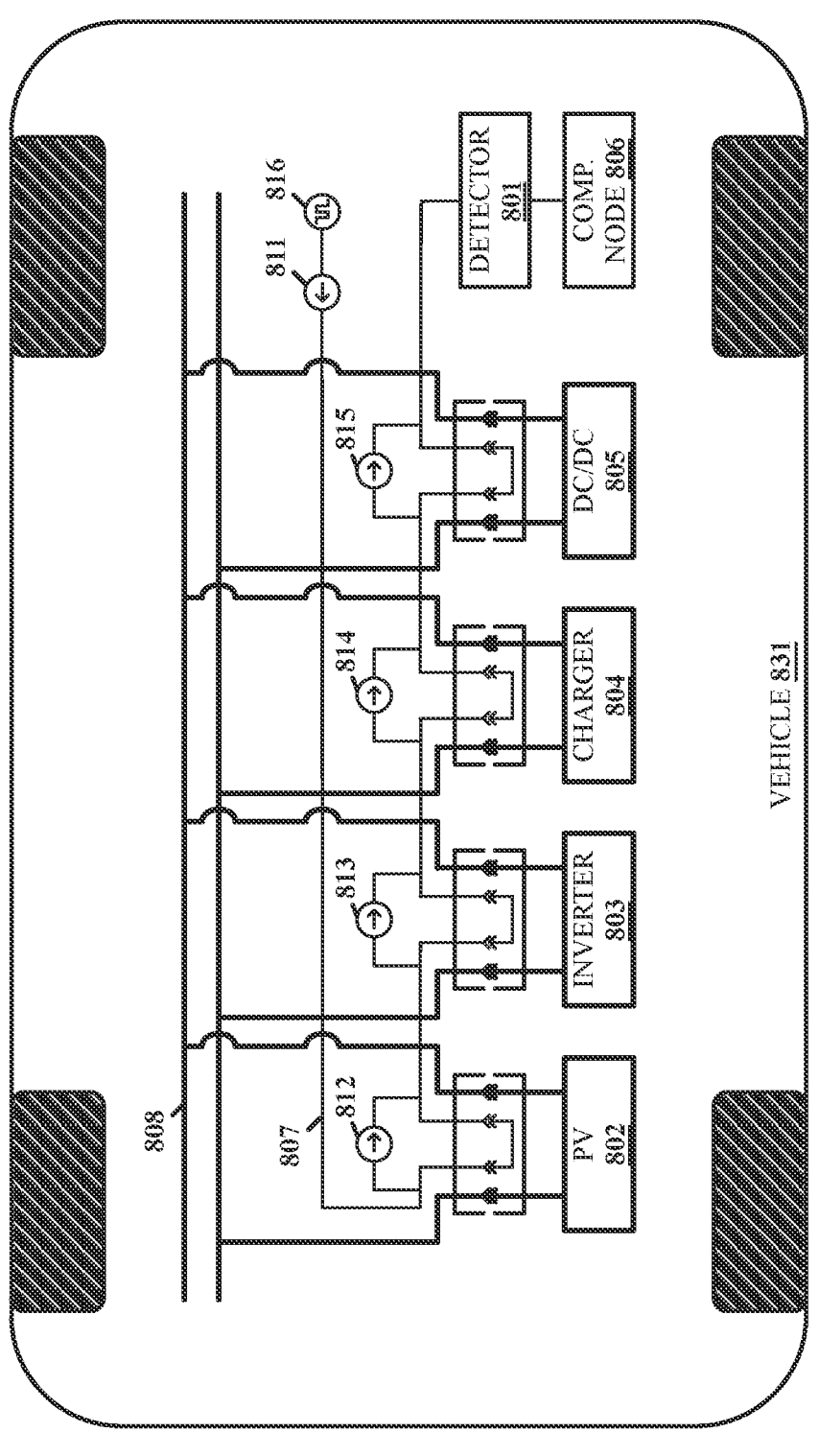
FIG. 8 illustrates an implementation of an intelligent high voltage interlock loop for individualized detection of connector connectivity in a vehicle.

FIG. 8 illustrates implementation 800 of an intelligent high voltage interlock loop for individualized detection of connector connectivity in a vehicle. In implementation 800, is an example where a high voltage interlock loop is installed in a vehicle. Specifically, current source 811 is installed in vehicle 831, which is a vehicle with a high voltage electric propulsion system. Vehicle 831 may be fully electric or may be a hybrid also having an internal combustion engine. Vehicle 831 includes photovoltaic module 802, traction inverter 803, battery charger 804, and DC/DC converter 805, which connect high voltage bus 808 via respective high voltage connectors. High voltage bus 808 carries high voltage direct current (DC) electrical power to and from a high voltage battery pack (not shown). Photovoltaic module 802 connects photovoltaic cells to high voltage bus 808 provide power from the cells onto high voltage bus 808 (i.e., to be stored in the battery pack or used by other components). Traction inverter 803 accepts power from high voltage bus 808 to power electric motors for propelling vehicle 831. In some examples, battery charger 804 may also return power to high voltage bus 808 when the motors are acting as a generator to slow vehicle 831. Battery charger 804 converts alternating current (AC) to DC and supplies the DC to high voltage bus 808 for charging the battery pack. DC/DC converter 805 converts the high voltage electricity from high voltage bus 808 into lower voltage electricity (e.g., 12 volts) typically used in automotive applications. Other vehicles may include different numbers or types of components than those shown in this example.

High voltage interlock loop 807 is installed in vehicle 831 to ensure proper connections between high voltage components 802-805 and high voltage bus 808. When each of components 802-805 are connected to high voltage bus 808 properly via their respective connectors, a loop current provided by current source 811 will pass through the connectors uninhibited and reach detector 801. Like in the example above, current source 811 is powered via a waveform generated by waveform generator 816. In this example, current sources 812-815 are wired in parallel with each of the jumpers for the connectors of high voltage components 802-805. When powered, the current generated by current source 812 is lower than the loop current, the current generated by current source 813 is lower than the current generated by current source 812, the current generated by current source 814 is lower than the current generated by current source 813, and the current generated by current source 815 is lower than the current generated by current source 815. The successively lower currents are necessary for the same reasons the first jumper current is lower than the loop current and the second jumper current is lower than the first jumper current in the examples above.

In an example, current source 811 may generate 40-milliamp current, current source 812 may generate a 36-milliamp current, current source 813 may generate a 32-milliamp current, current source 814 may generate a 28-milliamp current, and current source 815 may generate a 24-milliamp current. When detector 801 detects 40 milliamps, detector 801 determines that all high voltage components 802-805 are connected properly. When detector 801 detects 36 milliamps, detector 801 determines photovoltaic module 802 is disconnected. When detector 801 detects 32 milliamps, detector 801 determines at least traction inverter 803 is disconnected but photovoltaic module 802 may also be disconnected since current source 813 may be powered by the loop current or the 36-milliamp current from current source 812. Similarly, when detector 801 detects 28 milliamps, detector 801 determines at least battery charger 804 is disconnected but traction inverter 803 and photovoltaic module 802 may also be disconnected and, when detector 801 detects 24 milliamps, detector 801 determines at least DC/DC converter 805 is disconnected but battery charger 804, traction inverter 803, and photovoltaic module 802 may also be disconnected.

Given ambiguity that exists when detector 801 detects a current other than 40 or 36 milliamps, detector 801 may employ temporary jumpers like temporary jumper 601 discussed above to pinpoint whether other high voltage components are also disconnected. For instance, when detector 801 detects 28 milliamps, detector 801 may trigger a temporary jumper bypassing current source 814, which is generating the 28-milliamp current. If detector 801 detects 40 milliamps after bypassing current source 814, then detector 801 knows only battery charger 804 is disconnected. If detector 801 detects 32 milliamps, the detector 801 determines that traction inverter 803 is disconnected too. At that point, detector 801 still does not know whether photovoltaic module 802 is also disconnected so detector 801 triggers another temporary jumper bypassing current source 813. If detector 801 then detects 36-milliamps, detector 801 determines photovoltaic module 802 is also disconnected. Although, if 40 milliamps is detected then detector 801 determines that photovoltaic module 802 is connected. Detector 801 can, therefore, pinpoint individual ones of high voltage components 802-805 that are disconnected based on the currents detected.

In this example, detector 801 is connected to vehicle compute node 806, which handles at least a portion of the vehicle functionality for vehicle 831. Detector 801 notifies vehicle compute node 806 about which of high voltage components 802-805 detector 801 has determined is/are disconnected. Based on the notification from detector 801, vehicle compute node 806 may operate vehicle 831 differently than if all high voltage components 802-805 are connected. For instance, vehicle compute node 806 may turn off high voltage bus 808 to reduce the risk of electric shock to a user. Alternatively, vehicle compute node 806 may still allow vehicle to function while warning a user about the disconnections to ensure the user is not stuck on the side of the road. In another example, vehicle compute node 806 may notify the user (e.g., via a display of vehicle 831 or a fault reader connected to vehicle compute node 806) about the particular disconnected component(s) so the user may focus their actions to repair vehicle 831 on the disconnected component(s).

Figure 9:
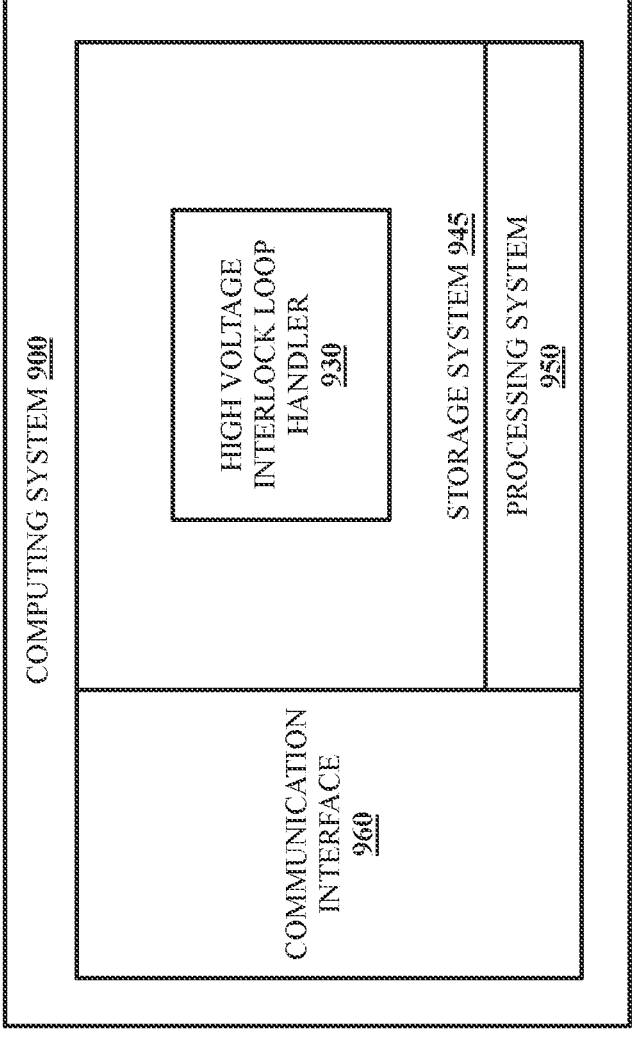
FIG. 9 illustrates a computing system for detecting connectivity of individual connectors with an intelligent high voltage interlock loop.

FIG. 9 illustrates computing system 900 for detecting connectivity of individual connectors with an intelligent high voltage interlock loop. Computing system 900 is representative of any computing system or systems with which the various operational architectures, processes, scenarios, and sequences disclosed herein can be implemented. Computing system 900 is an example architecture for vehicle compute node 806 or another type of external system shown in implementation 700, although other examples may exist. In some examples, detector 101 or detector 801 may include an architecture similar to computing system 900 in place of circuitry 703. Computing system 900 includes storage system 945, processing system 950, and communication interface 960. Processing system 950 is operatively linked to communication interface 960 and storage system 945. Communication interface 960 may be communicatively linked to storage system 945 in some implementations. Computing system 900 may further include other components such as a battery and enclosure that are not shown for clarity.

Communication interface 960 comprises components that communicate over communication links, such as network cards, ports, radio frequency (RF), processing circuitry and software, or some other communication devices. Communication interface 960 may be configured to communicate over metallic, wireless, or optical links. Communication interface 960 may be configured to use Time Division Multiplex (TDM), Internet Protocol (IP), Ethernet, optical networking, wireless protocols, communication signaling, or some other communication format—including combinations thereof. Communication interface 960 may be configured to communicate with one or more web servers and other computing systems via one or more networks.

Processing system 950 comprises microprocessor and other circuitry that retrieves and executes operating software from storage system 945. Storage system 945 may include volatile and nonvolatile, removable, and non-removable media implemented in any method or technology for storage of information, such as computer readable instructions, data structures, program modules, or other data. Storage system 945 may be implemented as a single storage device but may also be implemented across multiple storage devices or sub-systems. Storage system 945 may comprise additional elements, such as a controller to read operating software from the storage systems. Examples of storage media include random access memory, read only memory, magnetic disks, optical disks, and flash memory, as well as any combination or variation thereof, or any other type of storage media. In some implementations, the storage media may be a non-transitory storage media. In some instances, at least a portion of the storage media may be transitory. In no examples would storage media of storage system 945, or any other computer-readable storage medium herein, be considered a transitory form of signal transmission (often referred to as "signals per se"), such as a propagating electrical or electromagnetic signal or carrier wave.

Processing system 950 is typically mounted on a circuit board that may also hold the storage system. The operating software of storage system 945 comprises computer programs, firmware, or some other form of machine-readable program instructions. The operating software of storage system 945 comprises high voltage interlock loop handler 930. The operating software on storage system 945 may further include an operating system, utilities, drivers, network interfaces, applications, or some other type of software. When read and executed by processing system 950 the operating software on storage system 945 directs computing system 900 to perform the handling of notifications from detectors 101 and 801, as described herein. The operating software may execute natively on processing system 950 or the operating software may include virtualization software, such as a hypervisor, to virtualize computing hardware on which the operating software executes.

In at least one example, handler 930 directs processing system 950 to receive a signal from a detector connected to the high voltage interlock loop after a second-jumper current source. The detector transmits the signal indicating the connectivity of connectors and associated high voltage components with respect to a high voltage bus. In response to the signal, handler 930 notifies a user about the connectivity.

The included descriptions and figures depict specific implementations to teach those skilled in the art how to make and use the best mode. For teaching inventive principles, some conventional aspects have been simplified or omitted. Those skilled in the art will appreciate variations from these implementations that fall within the scope of the invention. Those skilled in the art will also appreciate that the features described above can be combined in various ways to form multiple implementations. As a result, the invention is not limited to the specific implementations described above, but only by the claims and their equivalents.

What is claimed is:

1. An apparatus for an intelligent high voltage interlock loop, the apparatus comprising:

a loop current source configured to transmit a loop current for the high voltage interlock loop;

a first-jumper current source connected to the high voltage interlock loop in parallel with a first jumper of a first high voltage connector, wherein the first-jumper current source is configured to transmit a first jumper current lower than the loop current;

a second-jumper current source connected to the high voltage interlock loop after the first-jumper current source and in parallel with a second jumper of a second high voltage connector, wherein the second-jumper current source is configured to transmit a second jumper current lower than the first jumper current; and a detector connected to the high voltage interlock loop after the second-jumper current source, wherein the detector is configured to determine connectivity of the first high voltage connector and the second high voltage connector based on whether the loop current, the first jumper current, or the second jumper current is received by the detector.

2. The apparatus of claim 1, wherein the detector determines that the first high voltage connector lacks connectivity when the first jumper current is received by the detector and the detector determines that the second high voltage connector lacks connectivity when the second jumper current is received by the detector.

3. The apparatus of claim 2, wherein, when the second high voltage connector lacks connectivity, the detector directs the second-jumper current source to be bypassed and determines that the first high voltage connector also lacks connectivity when the first jumper current is received by the detector.

4. The apparatus of claim 1, wherein the detector determines that the first high voltage connector and the second high voltage connector are both connected when the loop current is received by the detector.

5. The apparatus of claim 1, comprising:

a waveform generator configured to feed a voltage signal into the loop current source; and the detector configured to determine the high voltage interlock loop is working properly when the voltage signal is received by the detector.

6. The apparatus of claim 1, wherein the detector includes:

a current-to-voltage converter, wherein the detector reads the voltage across the current-to-voltage converter and computes whether the loop current, the first jumper current, or the second jumper current is being received.

7. The apparatus of claim 1, wherein the detector includes:

circuitry for communicating with a vehicle compute node of a vehicle in which the high voltage interlock loop is installed, wherein the circuitry notifies the vehicle compute node about the connectivity.

8. The apparatus of claim 1, wherein the detector includes:

circuitry for communicating with a manufacturing controller, wherein the circuitry notifies the manufacturing controller about the connectivity.

9. The apparatus of claim 1, wherein the high voltage interlock loop is included in a vehicle with a high voltage electrical bus.

10. The apparatus of claim 9, wherein the first high voltage connector and the second high voltage connector connect respective components to the high voltage electrical bus, wherein the components include one or more of the following:

a traction inverter;

a battery charger;

a DC/DC converter; and a photovoltaic module.

11. A method for intelligently detecting connector connectivity on a high voltage interlock loop, the method comprising:

transmitting a loop current for the high voltage interlock loop from a loop current source;

transmitting a first jumper current lower than the loop current from a first-jumper current source connected to the high voltage interlock loop in parallel with a first jumper of a first high voltage connector;

transmitting a second jumper current lower than the first jumper current from a second-jumper current source connected to the high voltage interlock loop after the first-jumper current source and in parallel with a second jumper of a second high voltage connector; and determining, in a detector connected to the high voltage interlock loop after the second-jumper current source, connectivity of the first high voltage connector and the second high voltage connector based on whether the loop current, the first jumper current, or the second jumper current is received by the detector.

12. The method of claim 11, wherein determining the connectivity comprises:

determining the first high voltage connector lacks connectivity when the first jumper current is received by the detector; and determining the second high voltage connector lacks connectivity when the second jumper current is received by the detector.

13. The method of claim 12, wherein, when the second high voltage connector lacks connectivity, determining the connectivity comprises:

directing the second-jumper current source to be bypassed; and determining the first high voltage connector also lacks connectivity when the first jumper current is received by the detector.

14. The method of claim 11, wherein determining the connectivity comprises:

determining the first high voltage connector and the second high voltage connector are both connected when the loop current is received by the detector.

15. The method of claim 11, comprising:

feeding a voltage signal from a waveform generator into the loop current source; and determining the high voltage interlock loop is working properly when the voltage signal is received by the detector.

16. The method of claim 11, wherein determining the connectivity comprises:

reading the voltage across a current-to-voltage converter; and computing whether the loop current, the first jumper current, or the second jumper current is being received.

17. The method of claim 11, comprising:

notifying a vehicle compute node of a vehicle in which the high voltage interlock loop is installed about the connectivity.

18. The method of claim 11, comprising:

notifying a manufacturing controller about the connectivity.

19. The method of claim 11, wherein the high voltage interlock loop is included in a vehicle with a high voltage electrical bus.

20. An apparatus to operate a vehicle having an intelligent high voltage interlock loop, the apparatus comprising:

one or more computer readable storage media;

a processing system operatively coupled with the one or more computer readable storage media; and program instructions stored on the one or more computer readable storage media that, when read and executed by the processing system, direct the apparatus to:

receive a signal from a detector connected to the high voltage interlock loop after a second-jumper current source, wherein:

a loop current source is configured to transmit a loop current for the high voltage interlock loop;

a first-jumper current source is connected to the high voltage interlock loop in parallel with a first jumper of a first high voltage connector and the first-jumper current source is configured to transmit a first jumper current lower than the loop current;

the second-jumper current source connected to the high voltage interlock loop after the first-jumper current source, in parallel with a second jumper of a second high voltage connector, and the second-jumper current source is configured to transmit a second jumper current lower than the first jumper current; and the detector configured to determine connectivity of the first high voltage connector and the second high voltage connector based on whether the loop current, the first jumper current, or the second jumper current is received by the detector, and transmits the signal indicating the connectivity; and in response to the signal, notifying a user of the vehicle about the connectivity.

* * * * *